(12) United States Patent
Hashimoto et al.

(10) Patent No.: US 10,930,491 B2
(45) Date of Patent: Feb. 23, 2021

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Yoshitomo Hashimoto, Toyama (JP); Hiroki Yamashita, Toyama (JP); Katsuyoshi Harada, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/555,543

(22) Filed: Aug. 29, 2019

(65) Prior Publication Data

US 2020/0090930 A1 Mar. 19, 2020

(30) Foreign Application Priority Data

Sep. 13, 2018 (JP) .............................. JP2018-171325

(51) Int. Cl.
*H01L 21/02* (2006.01)
*C23C 16/40* (2006.01)
*C23C 16/56* (2006.01)

(52) U.S. Cl.
CPC ...... *H01L 21/02164* (2013.01); *C23C 16/401* (2013.01); *C23C 16/56* (2013.01); *H01L 21/0223* (2013.01); *H01L 21/0228* (2013.01); *H01L 21/02126* (2013.01); *H01L 21/02167* (2013.01); *H01L 21/02208* (2013.01); *H01L 21/02326* (2013.01)

(58) Field of Classification Search
None
See application file for complete search history.

(56) References Cited

U.S. PATENT DOCUMENTS

| 2005/0196533 | A1 | 9/2005 | Hasebe et al. |
| 2012/0161295 | A1* | 6/2012 | Michalak ............ H01L 51/0035 257/632 |
| 2013/0078392 | A1* | 3/2013 | Xiao ........................ C07F 7/12 427/579 |

(Continued)

FOREIGN PATENT DOCUMENTS

| JP | 2005-123275 A | 5/2005 |
| JP | 2011-238894 A | 11/2011 |
| JP | 2014-056871 A | 3/2014 |

*Primary Examiner* — Asok K Sarkar
(74) *Attorney, Agent, or Firm* — Volpe Koenig

(57) ABSTRACT

There is provided a technique that includes: (a) forming a first film including a cyclic structure composed of silicon and carbon and also including nitrogen so as to fill a recess formed in a surface of a substrate by performing a cycle a predetermined number of times, the cycle including non-simultaneously performing: supplying a precursor including the cyclic structure and also including halogen to the substrate having the recess formed on its surface; and supplying a nitriding agent to the substrate; (b) converting the first film into a second film including the cyclic structure and also including oxygen by supplying a first oxidizing agent to the substrate; and (c) converting the second film into a third film including silicon and oxygen and not including carbon and nitrogen by supplying a second oxidizing agent to the substrate.

18 Claims, 8 Drawing Sheets

(56) References Cited

U.S. PATENT DOCUMENTS

| | | | |
|---|---|---|---|
| 2013/0123528 A1* | 5/2013 | Tada | C23C 16/401 |
| | | | 556/407 |
| 2014/0024225 A1 | 1/2014 | Hirose et al. | |
| 2014/0073142 A1 | 3/2014 | Hirose et al. | |
| 2014/0209026 A1* | 7/2014 | LaVoie | H01L 21/02219 |
| | | | 118/723 R |
| 2018/0023192 A1* | 1/2018 | Chandra | H01L 21/02354 |
| | | | 438/760 |
| 2019/0221425 A1* | 7/2019 | Hashimoto | C23C 16/52 |

\* cited by examiner

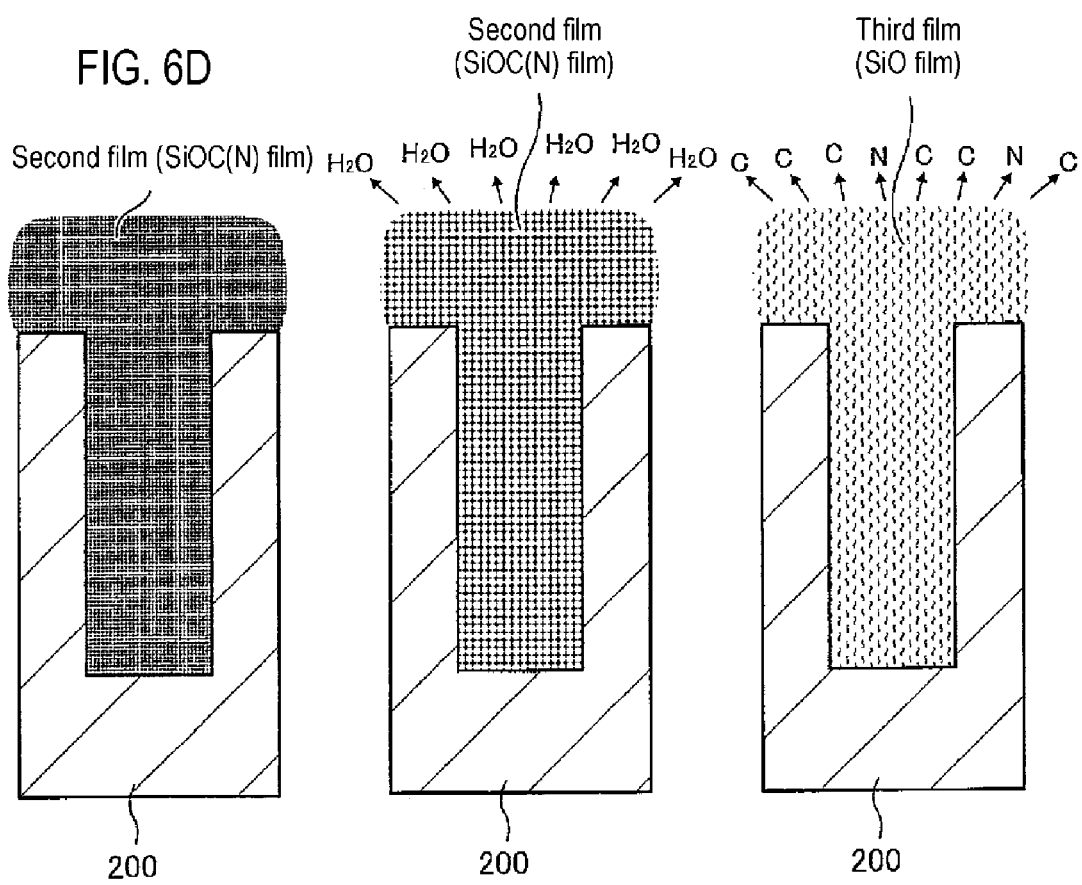

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2018-171325, filed on Sep. 13, 2018, the entire contents of which are incorporated herein by reference.

TECHNICAL FIELD

The present disclosure relates to a method of manufacturing a semiconductor device, a substrate processing apparatus, and a recording medium.

BACKGROUND

As a process of manufacturing a semiconductor device, a process of forming a film such as a silicon oxycarbonitride film (SiOCN film) on a substrate is often carried out in the related art. Further, in the related art, a process of forming a film such as a silicon boron carbonitride film (SiBCN film) including a cyclic structure such as a borazine ring skeleton on a substrate is also often carried out.

SUMMARY

Some embodiments of the present disclosure provide a technique capable of forming a seamless and void-free film on a substrate having recesses such as trenches and holes formed on its surface.

According to an embodiment of the present disclosure, there is provided a technique including: (a) forming a first film including a cyclic structure composed of silicon and carbon and also including nitrogen so as to fill a recess formed in a surface of a substrate by performing a cycle a predetermined number of times, the cycle including non-simultaneously performing: supplying a precursor including the cyclic structure and also including halogen to the substrate having the recess formed on its surface; and supplying a nitriding agent to the substrate; (b) converting the first film into a second film including the cyclic structure and also including oxygen by supplying a first oxidizing agent to the substrate; and (c) converting the second film into a third film including silicon and oxygen and not including carbon and nitrogen by supplying a second oxidizing agent to the substrate.

BRIEF DESCRIPTION OF DRAWINGS

FIG. 6D shows an enlarged sectional view of the wafer when a $H_2O$ annealing process is performed after the film-forming process, FIG. 6E shows an enlarged sectional view of the wafer when a $N_2$ annealing process is performed after the $H_2O$ annealing process and an image of water desorption in the $N_2$ annealing process, and FIG. 6F shows an enlarged sectional view of the wafer when a plasma oxidizing process is performed after the $N_2$ annealing process an image of C and N desorption in the plasma oxidizing process.

DETAILED DESCRIPTION

Figure 1:
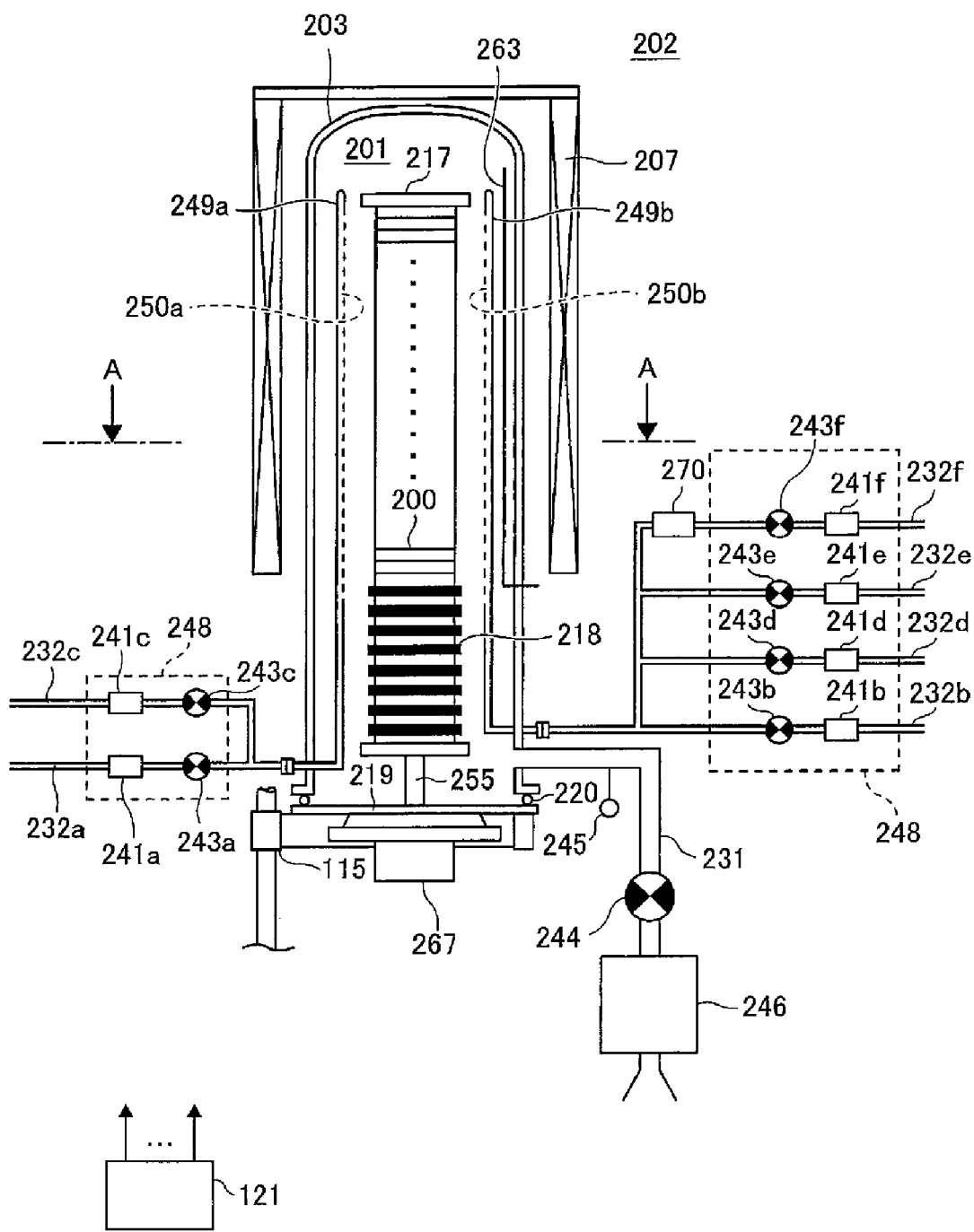
FIG. 1 is a schematic configuration view of a vertical process furnace of a substrate processing apparatus suitably used in an embodiment of the present disclosure, in which a portion of the process furnace is shown in a vertical cross-sectional view.

A CVD (Chemical Vapor Deposition) method commonly known as a deposition method is not isotropic in terms of a deposition rate with respect to a three-dimensional substrate surface. When a film is formed on a substrate surface which is not planar, e.g., a substrate surface on which trench-shaped patterns, hole-shaped patterns or both thereof are formed, it is difficult for the existing CVD method to control film thickness in recesses such as trenches or holes. In particular, in recesses, the film thickness of the bottom portion becomes thinner than the film thickness of the top portion, thereby generating a film thickness difference (i.e., decreasing a step coverage). This is because it is difficult to uniformly supply molecules generated by vapor-phase reaction to various portions of recesses in the CVD method. Further, it is known that a pattern having a larger aspect ratio in the recesses results in a larger film thickness difference between the bottom portion and the top portion (deterioration of the step coverage). Furthermore, film formation on the top portion of the recesses proceeds at a higher speed than the bottom portion thereof. Therefore, if an opening of the recesses is blocked, supply of molecules generated by vapor-phase reaction or precursor gas in the recesses may be inhibited after the blocking, thereby generating seams or voids.

On the other hand, it is conceivable to form a film using an ALD (Atomic Layer Deposition) method which can obtain an isotropic deposition rate with respect to a three-dimensional substrate surface. However, this method may have a problem of the above-described blocking of a top portion of the patterns including recesses such as trenches or holes having a reverse tapered shape when the film formation is performed on such patterns.

Further, a method of forming a film having a predetermined film thickness on a recess and then controlling a film shape in the recess by etching the film or method of performing the film formation while controlling the film shape in the recess by repeating the above-mentioned film formation and etching plural times (deposition-etching-deposition) may be used. However, these methods increase the time required to obtain a film having both desired thickness and shape compatible with each other. Further, since there is a need for an etching apparatus as well as a film-forming apparatus, there is a problem of deterioration of production efficiency and increase in production costs.

In order to cope with the aforementioned situation, a precursor including a cyclic structure composed of silicon (Si) and carbon (C) and containing chlorine (Cl) as halogen and a nitriding agent containing nitrogen (N) are used to form a silicon carbonitride (SiCN) film including a cyclic structure composed of Si and C so as to fill a recess such as a trench or hole formed on the surface of a substrate, and the SiCN film is converted into a silicon oxycarbide (SiOC) film or a silicon oxycarbonitride (SiOCN) film (hereinafter referred to as a SiOC(N) film) by supplying a first oxidizing agent containing oxygen (O) to the SiCN film. A film growth (film expansion) generated at this time may eliminate seams or voids occurred in the SiCN film when the SiCN film is formed.

However, as described above, the film formed in the recess formed on the surface of the substrate has a SiOC(N) composition, and the C component and the N component present in the film may cause a leak current, affect electrical characteristics or affect processing resistance depending on an application process, which may have an adverse effect on devices.

In order to cope with the aforementioned situation, the present inventors have found that, by supplying a second oxidizing agent containing O to the SiOC(N) film formed in the recess formed on the substrate surface, C or C and N (hereinafter referred to as C(N)) contained in the SiOC(N) film can be desorbed to convert (modify) the SiOC(N) film into a silicon oxide film ($SiO_2$ film, hereinafter also referred to as a SiO film). The present disclosure is made based on the above findings of the present inventors.

Embodiments of the Present Disclosure

Embodiments of the present disclosure will be now described with reference to FIGS. 1 to 5.

(1) Configuration of Substrate Processing Apparatus

As shown in FIG. 1, a process furnace 202 includes a heater 207 as a heating mechanism (a temperature adjustment part). The heater 207 has a cylindrical shape and is vertically installed by being supported by a holding plate. The heater 207 functions as an activation mechanism (an excitation part) configured to thermally activate (excite) a gas.

A reaction tube 203 is disposed inside the heater 207 in a concentric relationship with the heater 207. The reaction tube 203 is made of a heat resistant material such as quartz ($SiO_2$) or silicon carbide (SiC) and is formed in a cylindrical shape with its upper end closed and its lower end opened. A process chamber 201 is formed in a hollow cylindrical portion of the reaction tube 203. The process chamber 201 is configured to be able to accommodate wafers 200 as substrates.

Nozzles 249a and 249b are installed in the process chamber 201 so as to pass through the lower side wall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are installed in the gas supply pipes 232a and 232b, respectively, in order from the upstream side. A gas supply pipe 232c is connected to the gas supply pipe 232a at the downstream side of the valve 243a. Gas supply pipes 232d, 232e and 232f are connected to the gas supply pipe 232b at the downstream side of the valve 243b. MFCs 241c, 241d and 241e and valves 243c, 243d and 243e are installed in the gas supply pipes 232c, 232d and 232e, respectively, in order from the upstream side of gas flow. An MFC 241f, a valve 243f and a plasma generation mechanism 270 as a plasma generation part (plasma source) are installed in the gas supply pipe 232f in order from the upstream side of gas flow. The plasma generation mechanism 270 functions as a plasma excitation part (activation mechanism) that excites (activates) a gas into a plasma state.

Figure 2:
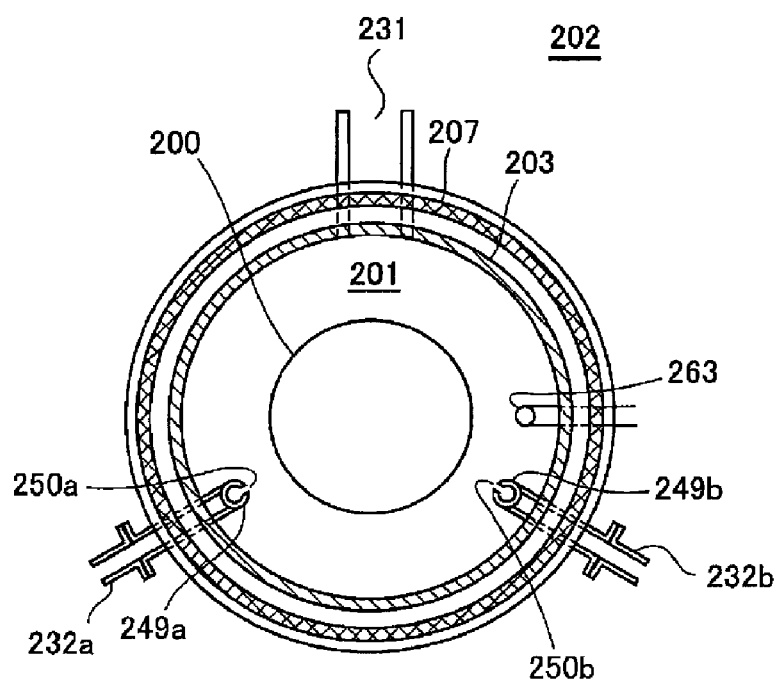
FIG. 2 is a schematic configuration view of the vertical process furnace of the substrate processing apparatus suitably used in an embodiment of the present disclosure, in which a portion of the process furnace is shown in a cross-sectional view taken along line A-A in FIG. 1.

As shown in FIG. 2, the nozzles 249a and 249b are disposed in an annular space, when seen in plane view, between an inner wall of the reaction tube 203 and the wafers 200 such that the nozzles 249a and 249b extend upward along a stack direction of the wafers 200 from a lower portion of the inner wall of the reaction tube 203 to an upper portion thereof. Specifically, the nozzles 249a and 249b are respectively installed in a region horizontally surrounding a wafer arrangement region in which the wafers 200 are arranged at the lateral side of the wafer arrangement region, along the wafer arrangement region. Gas supply holes 250a and 250b for supplying a gas are respectively formed on the side surfaces of the nozzles 249a and 249b. The gas supply holes 250a and 250b are respectively opened toward the center of the reaction tube 203 to allow the gas to be supplied toward the wafers 200. A plurality of gas supply holes 250a and 250b may be formed between the lower portion and the upper portion of the reaction tube 203f.

Figure 5:
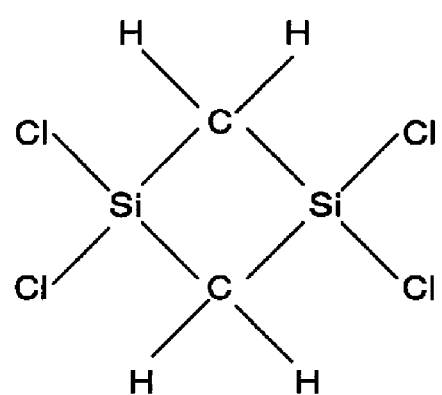
FIG. 5 is a view showing a chemical structural formula of 1,1,3,3-tetrachloro-1,3-disilacyclobutane used as a precursor.

A precursor, for example, a gas including a cyclic structure composed of Si and C and containing halogen, is supplied from the gas supply pipe 232a into the process chamber 201 via the MFC 241a, the valve 243a and the nozzle 249a. The precursor acts as a Si source and a C source. An example of the precursor may include a 1,1,3,3-tetrachloro-1,3-disilacyclobutane ($C_2H_4Cl_4Si_2$, abbreviation: TCDSCB) gas. FIG. 5 shows the chemical structural formula of TCDSCB. TCDSCB includes a cyclic structure composed of Si and C and contains chlorine (Cl) as halogen. Hereinafter, the cyclic structure composed of Si and C is simply referred to as a cyclic structure for the sake of convenience. The shape of the cyclic structure included in TCDSCB is square. The cyclic structure consists of Si and C bonded alternately, including four Si—C bonds including two Si atoms and two C atoms. In the cyclic structure, Cl is bonded to Si, and hydrogen (H) is bonded to C. That is, the TCDSCB includes Si—Cl bonds and C—H bonds in addition to the Si—C bonds.

A reactant, for example, a nitrogen (N)-containing gas, is supplied from the gas supply pipe 232b into the process chamber 201 via the MFC 241b, the valve 243b and the nozzle 249b. An example of the N-containing gas may include a hydrogen nitride-based gas as a nitriding agent (nitriding gas). The hydrogen nitride-based gas may be a substance containing N and H and consisting of two elements of N and H and acts as an N source. An example of the hydrogen nitride-based gas may include an ammonia ($NH_3$) gas.

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b and the nozzles 249a and 249b. The $N_2$ gas acts as a purge gas, a carrier gas, a dilution gas or the like.

A first oxidizing agent, for example, an O-containing gas, is supplied from the gas supply pipe 232e into the process chamber 201 via the MFC 241e, the valve 243e, the gas supply pipe 232b and the nozzle 249b. The O-containing gas acts as an oxidizing agent (oxidizing gas), that is, an O source. An example of the O-containing gas may include vapor ($H_2O$ gas).

An O-containing gas, for example, is supplied from the gas supply pipe 232f into the process chamber 201 via the MFC 241f, the valve 243f, the plasma generation mechanism 270, the gas supply pipe 232b and the nozzle 249b. An example of the O-containing gas may include an oxygen ($O_2$) gas. The flow rate of the $O_2$ gas is adjusted by the MFC 241f and the $O_2$ gas is plasma-excited by the plasma generation mechanism 270 and is supplied, as a second oxidizing agent containing active species ($O_2^*$, $0^*$), into the process chamber 201 via the gas supply pipe 232b and the nozzle 249b. That is, the plasma-excited $O_2$ gas containing active species ($O_2^*$, $0^*$) is supplied, as a second oxidizing agent, into the process chamber 201. Hereinafter, the plasma-excited $O_2$ gas is also referred to as $O_2^*$ for the sake of convenience.

A precursor supply system is mainly constituted by the gas supply pipe 232a, the MFC 241a and the valve 243a. A nitriding agent supply system is mainly constituted by the gas supply pipe 232b, the MFC 241b and the valves 243b. A first oxidizing agent supply system is mainly constituted by the gas supply pipe 232e, the MFC 241e and the valves 243e. A second oxidizing agent supply system is mainly constituted by the gas supply pipe 232f, the MFC 241f, the valves 243f, and the plasma generation mechanism 270. An inert gas supply system is mainly constituted by the gas supply pipes 232c and 232d, the MFCs 241c and 241d and the valves 243c and 243d.

Any one or all of the above-described various supply systems may be configured as an integrated supply system 248 in which the valves 243a to 243f, the MFCs 241a to 241f and the like are integrated. The integrated supply system 248 is connected to each of the gas supply pipes 232a to 232f and is configured such that the operations of supplying various gases into the gas supply pipes 232a to 232f, that is, the opening and closing operation of the valves 243a to 243d and the flow rate regulating operation by the MFCs 241a to 241f, and the like, are controlled by a controller 121 which will be described later. The integrated supply system 248 is configured as an integral type or division type integrated unit and can be attached to and detached from the gas supply pipes 232a to 232f or the like on an integrated unit basis. Further, maintenance, replacement, extension and the like of the integrated supply system 248 can be performed on an integrated unit basis.

An exhaust pipe 231 for exhausting an internal atmosphere of the process chamber 201 is connected to the lower side of the side wall of the reaction tube 203. A vacuum exhaust device, e.g., a vacuum pump 246, is connected to the exhaust pipe 231 via a pressure sensor 245, which is a pressure detector (pressure detecting part) for detecting an internal pressure of the process chamber 201 and an auto pressure controller (APC) valve 244, which is a pressure regulator (pressure regulating part). The APC valve 244 is configured to perform or stop vacuum exhaust in the process chamber 201 by opening or closing the valve while the vacuum pump 246 is actuated and is further configured to regulate the internal pressure of the process chamber 201 by adjusting an opening degree of the valve based on pressure information detected by the pressure sensor 245 while the vacuum pump 246 is actuated. An exhaust system is mainly constituted by the exhaust pipe 231, the pressure sensor 245 and the APC valve 244. The vacuum pump 246 may be included in the exhaust system.

A seal cap 219, which serves as a furnace opening cover configured to hermetically seal the lower end opening of the reaction tube 203, is installed under the reaction tube 203. The seal cap 219 is made of metal material such as, e.g., SUS or the like, and is formed in a disc shape. An O-ring 220, which is a seal member making contact with the lower end of the reaction tube 203, is installed on the upper surface of the seal cap 219. A rotation mechanism 267 configured to rotate a boat 217, which will be described later, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevating instrument installed outside the reaction tube 203. The boat elevator 215 is configured as a transfer device (transfer mechanism) which loads and unloads (transfers) the wafers 200 into and from the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
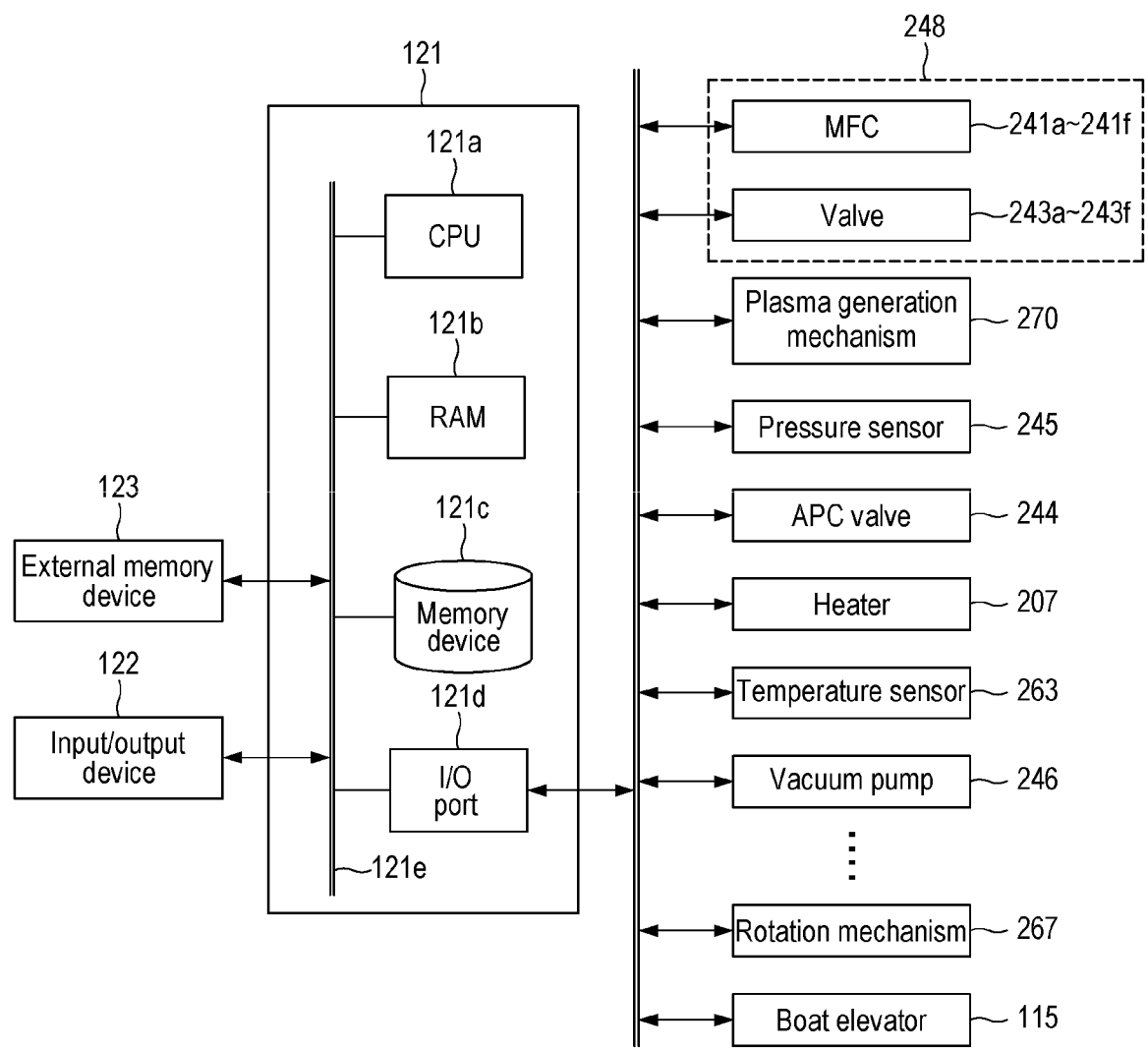
FIG. 3 is a schematic configuration diagram of a controller of the substrate processing apparatus suitably used in an embodiment of the present disclosure, in which a control system of the controller is shown in a block diagram.

As illustrated in FIG. 3, a controller 121, which is a control part (control unit), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 constituted by, e.g., a touch panel or the like, is connected to the controller 121.

The memory device 121c is constituted by, for example, a flash memory, a hard disk drive (HDD) or the like. A control program for controlling operations of a substrate processing apparatus and a process recipe, in which sequences and conditions of substrate processing to be described later are written, are readably stored in the memory device 121c. The process recipe function as a program for causing the controller 121 to execute each sequence in the substrate processing process, which will be described later, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121*b* is configured as a memory area (work area) in which a program or data read by the CPU 121*a* is temporarily stored.

The I/O port 121*d* is connected to the MFCs 241*a* to 241*f*, the valves 243*a* to 243*f*, the plasma generation mechanism 270, the pressure sensor 245, the APC valve 244, the heater 207, the temperature sensor 263, the vacuum pump 246, the rotation mechanism 267, the boat elevator 115, and so on.

The CPU 121*a* is configured to read and execute the control program from the memory device 121*c*. The CPU 121*a* also reads the recipe from the memory device 121*c* according to an input of an operation command from the input/output device 122. The CPU 121*a* is configured to control a flow rate adjusting operation of various kinds of gases by the MFCs 241*a* to 241*f*, an opening/closing operation of the valves 243*a* to 243*f*, a plasma generating operation performed by the plasma generation mechanism 270, an opening/closing operation of the APC valve 244, a pressure regulating operation performed by the APC valve 244 based on the pressure sensor 245, driving and stopping of the vacuum pump 246, a temperature adjusting operation performed by the heater 207 based on the temperature sensor 263, an operation of rotating the boat 217 with the rotation mechanism 267 and adjusting a rotation speed of the boat 217, an operation of moving the boat 217 up and down with the boat elevator 115, and so on, according to contents of the read recipe.

The controller 121 may be configured by installing, on a computer, the aforementioned program stored in an external memory device 123. The external memory device 123 includes, for example, a magnetic disk such as an HDD, an optical disk such as a CD, a magneto-optical disk such as an MO, a semiconductor memory such as a USB memory, or the like. The memory device 121*c* or the external memory device 123 is configured as a computer-readable recording medium. Hereinafter, the memory device 121*c* and the external memory device 123 will be generally and simply referred to as a "recording medium." When the term "recording medium" is used herein, it may indicate a case of including only the memory device 121*c*, a case of including only the external memory device 123, or a case of including both the memory device 121*c* and the external memory device 123. Alternatively, the program may be supplied to the computer using communication means such as the Internet or a dedicated line, instead of using the external memory device 123.

(2) Substrate Processing Process

A sequence example of forming a SiCN film as a first film, converting the SiCN film to a SiOC(N) film as a second film, and converting the SiOC(N) film to a SiO film as a third film on a wafer 200 as a substrate with recesses such as trenches or holes formed on its surface using the aforementioned substrate processing apparatus, which is one of the processes for manufacturing a semiconductor device, will be mainly described below with reference to FIGS. 4 and 6A to 6F. In the following description, operations of the respective parts constituting the substrate processing apparatus are controlled by the controller 121.

Figure 4:
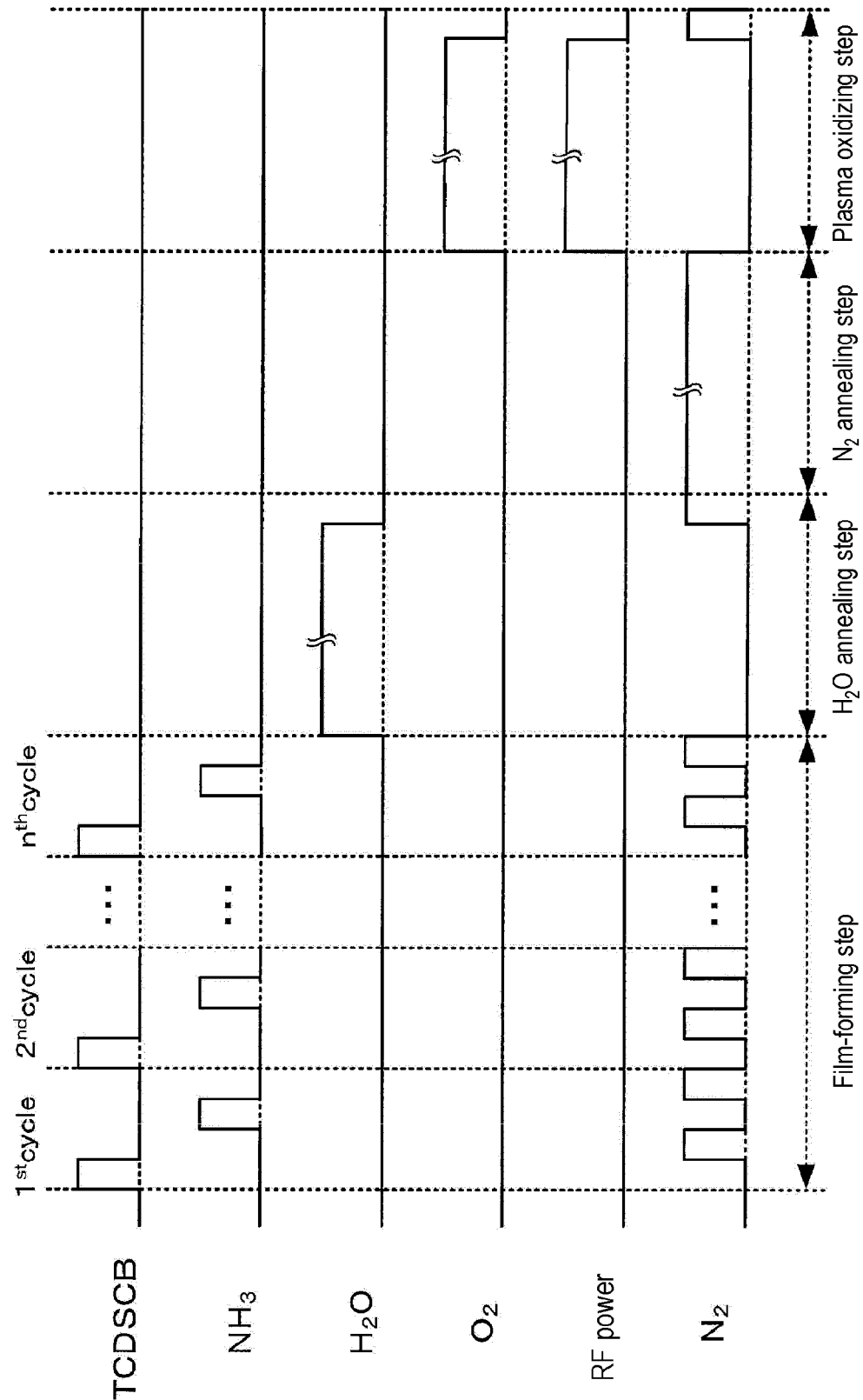
FIG. 4 is a flow diagram showing a substrate processing sequence according to an embodiment of the present disclosure.
Figure 6A:
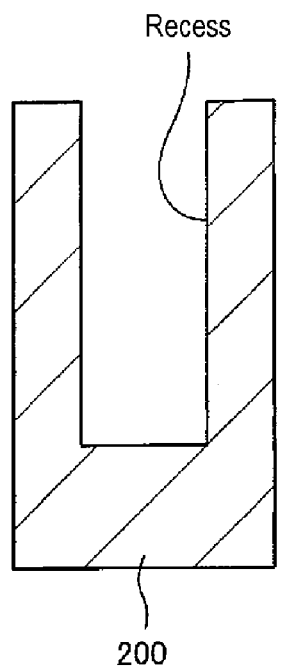
FIGS. 6A to 6C are enlarged sectional views of a wafer when a film-forming process is performed so as to fill a recess formed in a surface of the wafer.

The substrate processing sequence shown in FIG. 4 includes: a film-forming step of forming a first film including a cyclic structure composed of Si and C and containing N so as to fill a recess formed in the surface of a wafer 200 by performing a cycle a predetermined number of times, the cycle including non-simultaneously performing a step 1 of supplying a TCDSCB gas as a precursor including a cyclic structure composed of Si and C and containing Cl as halogen to the wafer 200 having the recess formed on its surface and a step 2 of supplying an $NH_3$ gas as a nitriding agent to the wafer 200 (FIGS. 6A to 6C); a $H_2O$ annealing step of converting the first film into a second film including a cyclic structure composed of Si and C and containing O by supplying a $H_2O$ gas as a first oxidizing agent to the wafer 200 (FIG. 6D); and a plasma oxidizing step of converting the second film into a third film containing Si and O and not containing C and N by supplying a plasma-excited $O_2$ gas as a second oxidizing agent to the wafer 200 (FIG. 6F).

Further, the second film contains water, and a $N_2$ annealing step (FIG. 6E) is further performed to desorb the water contained in the second film. In addition, the $N_2$ annealing step may be performed after the $H_2O$ annealing step and before the plasma oxidizing step in some embodiments.

Figure 6B:
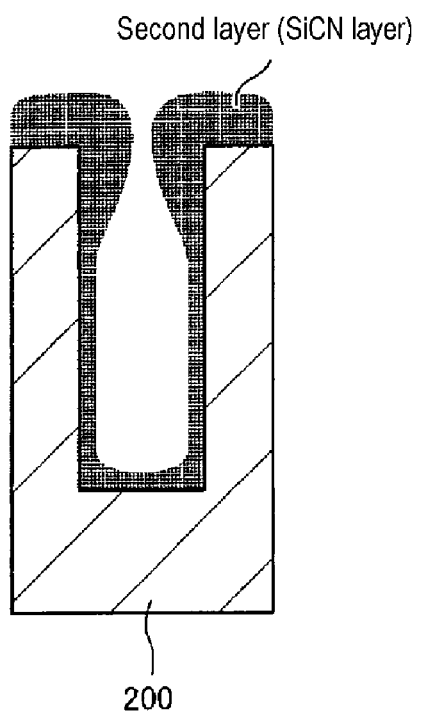
Figure 6C:
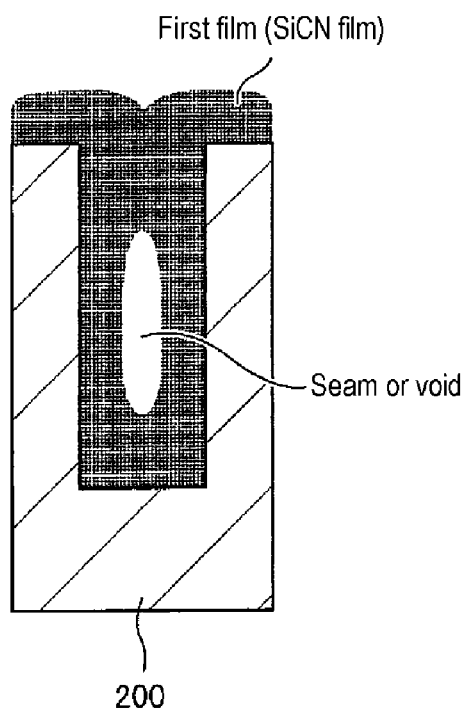

In the film-forming step, as shown in FIGS. 6A to 6C, the first film including a cyclic structure composed of Si and C and containing N is formed so as to fill a recess formed in the surface of the wafer 200. The first film is a film containing Si, C and N and not containing O, that is, a SiCN film. That is, in the film-forming step, a SiCN film containing N is formed while maintaining the cyclic structure composed of Si and C contained in the TCDSCB gas. In addition, in the film-forming step, N contained in the $NH_3$ gas is taken into the first film in a state where H is bonded to N. Immediately after the film-forming step, as shown in FIG. 6C, the opening of the recess is closed, seams and voids occur in the first film, and the first film becomes a film having seams and voids.

In the $H_2O$ annealing step, the first film is oxidized using a $H_2O$ gas as a first oxidizing agent to convert the first film into a second film including a cyclic structure composed of Si and C and containing O. That is, N in the SiCN film is substituted with O while maintaining the cyclic structure composed of Si and C contained in the SiCN film as the first film. The second film is a film containing Si, C and O, or a film containing Si, C, O and N, that is, a SiOC(N) film. In addition, in the $H_2O$ annealing step, the first film is converted into the second film by substituting N contained in the first film with O contained in the $H_2O$ gas. As a result, as shown in FIG. 6D, the first film grew (expanded) and the thickness of the second film obtained by this processing ($H_2O$ annealing) is made thicker than the thickness of the first film. Then, the seams and voids of the first film can be eliminated by this film growth. As a result, the second film becomes seamless and void-free.

In the $N_2$ annealing step, the water contained in the second film is desorbed. That is, as shown in FIG. 6E, the water contained in the SiOC(N) film is removed while maintaining the cyclic structure composed of Si and C contained in the SiOC(N) film.

In the plasma oxidizing step, the second film is oxidized using a plasma-excited $O_2$ gas as a second oxidizing agent under conditions different from those in the $H_2O$ annealing step to convert the second film into a third film containing Si and O and not containing C and N. Specifically, in the plasma oxidizing step, the second film is oxidized under conditions where an oxidizing power is higher than an oxidizing power in the $H_2O$ annealing step. At that time, the cyclic structure composed of Si and C contained in the SiOC(N) film as the second film is broken (Si—C bond is cut) and C or C and N, i.e., C(N), contained in the SiOC (N) film is desorbed and removed. As shown in FIG. 6F, the third film is a film containing Si and O and not containing C and N, that is, a SiO film.

Here, in the $H_2O$ annealing step, there are a case where N contained in the SiCN film is all substituted with O contained in the $H_2O$ gas and the SiCN film is modified into a SiOC film, and a case where N contained in the SiCN film remains without being substituted with O contained in the $H_2O$ gas and the SiCN film is modified into a SiOCN film. When the SiCN film is modified into a SiOC film in the $H_2O$ annealing step, C is desorbed from the SiOC film to modify the SiOC film into a SiO film in the plasma oxidizing step. When the SiCN film is modified into a SiOCN film in the $H_2O$ annealing step, C and N are desorbed from the SiOCN film to modify the SiOCN film into a SiO film in the plasma oxidizing step.

In the present disclosure, the substrate processing sequence shown in FIG. 4 may be expressed as follows for the sake of convenience. The same notation is used for substrate processing sequences in modifications to be described later.

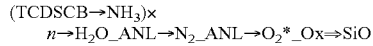

(TCDSCB→NH₃)×
  $n$→H₂O_ANL→N₂_ANL→O₂*_Ox⇒SiO

When the term "wafer" is used in the present disclosure, it may refer to "a wafer itself" or "a wafer and a laminated body of predetermined layers or films formed on a surface of the wafer." When the phrase "a surface of a wafer" is used in the present disclosure, it may refer to "a surface of a wafer itself" or "a surface of a predetermined layer formed on a wafer." When the expression "a predetermined layer is formed on a wafer" is used in the present disclosure, it may mean that "a predetermined layer is directly formed on a surface of a wafer itself" or that "a predetermined layer is formed on a layer formed on a wafer." When the term "substrate" is used in the present disclosure, it may be synonymous with the term "wafer."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the reaction tube 203 through the O-ring 220.

(Pressure Adjustment and Temperature Adjustment)

The interior of the process chamber 201, namely, a space in which the wafers 200 exist, is vacuum-exhausted (de-pressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. The rotation of the wafers 200 by the rotation mechanism 267 begins. The actuation of the vacuum pump 246 and the heating and rotation of the wafers 200 may be continuously performed at least until the processing of the wafers 200 is completed.

(Film-Forming Step)

Thereafter, the following steps 1 and 2 are sequentially executed.

[Step 1]

In this step, a TCDSCB gas is supplied as a precursor to the wafers 200 accommodated in the process chamber 201 and having a recess formed on its surface as shown in FIG. 6A. Specifically, the valve 243a is opened to flow the TCDSCB gas into the gas supply pipe 232a. The flow rate of the TCDSCB gas is adjusted by the MFC 241a, supplied into the process chamber 201 via the nozzle 249a, and exhausted from the exhaust pipe 231. At this time, the TCDSCB gas is supplied to the wafers 200. At this time, the valves 243c and 243d may be opened to flow an $N_2$ gas into the gas supply pipes 232c and 232d.

Process conditions of this step are exemplified as follows.
Processing temperature: 200 to 400 degrees C., specifically 250 to 350 degrees C. in some embodiments
Processing pressure: 1 to 20 Torr (133 to 2,666 Pa)
TCDSCB gas supply flow rate: 1 to 2,000 sccm
$N_2$ gas supply flow rate (each gas supply pipe): 0 to 10,000 sccm
Each gas supply time: 1 to 120 seconds, specifically 5 to 60 seconds in some embodiments In the present disclosure, notation of a numerical range such as "200 to 400 degrees C." means that a lower limit value and an upper limit value are included in the range. For example, "200 to 400 degrees C." means "equal to or higher than 200 degrees C. and equal to or lower than 400 degrees C." The same applies to other numerical ranges.

The above-mentioned process conditions, particularly the temperature conditions, are the conditions that at least a part of the cyclic structure composed of Si and C included in TCDSCB can be held (maintained) without being destructed. That is, the above-mentioned process conditions are the conditions under which at least a part of a plurality of Si—C bonds which form a plurality of cyclic structures included in the TCDSCB gas (plural TCDSCB molecules) supplied to the wafers 200 are held as they are. As described above, in the present disclosure, a cyclic structure composed of Si and C is also simply referred to as a cyclic structure.

By supplying the TCDSCB gas to the wafers 200 under the above-mentioned conditions, a first layer (initial layer) including a cyclic structure and also including Cl as halogen is formed on the outermost surface of the wafer(s) 200. That is, a layer including a cyclic structure composed of Si and C and containing Cl is formed as the first layer. At least a part of the plurality of cyclic structures included in the TCDSCB gas are introduced, as they are without being destructed, into the first layer. In addition, the first layer may include a chain structure generated when a part of a plurality of Si—C bonds constituting the cyclic structure are broken. Further, the first layer may include at least one of a Si—Cl bond and a C—H bond.

After forming the first layer on the wafer 200, the valve 243a is closed to stop the supply of TCDSCB gas into the process chamber 201. Then, the interior of the process chamber 201 is vacuum-exhausted to exclude the gas or the like remaining in the process chamber 201 from the interior of the process chamber 201. At this time, the valves 243c and 243d are opened to supply an $N_2$ gas into the process chamber 201. The $N_2$ gas acts as a purge gas.

An example of the precursor may include a 1,1,3,3-tetrachloro-1,3-disilacyclopentane ($C_3H_6Cl_4Si_2$) gas in addition to the TCDSCB gas. That is, the shape of the cyclic structure composed of Si and C included in the precursor is not limited to square. In addition, this cyclic structure is not limited to a case where Si and C are alternately bonded. Another example of the precursor may include a 1,1,3,3-tetrafluoro-1,3-disilacyclobutane ($C_2H_4F_4Si_2$) gas. That is, halogen contained in the precursor is not limited to Cl but may be fluorine (F), bromine (Br) or iodine (I).

An example of the inert gas may include a rare gas such as an Ar gas, a He gas, a Ne gas or a Xe gas, in addition to the $N_2$ gas. The same applies to the step 2, the $H_2O$ annealing step, the $N_2$ annealing step and the plasma oxidizing step to be described below.

[Step 2]

After the step 1 is completed, an $NH_3$ gas is supplied to the wafer 200 in the process chamber 201, that is, to the first layer formed on the wafer 200. Specifically, the opening/closing control of the valves 243b to 243d is performed in the same procedure as the opening/closing control of the valves 243a, 243c and 243d in the step 1. The flow rate of the $NH_3$ gas is adjusted by the MFC 241b, supplied into the process chamber 201 via the nozzle 249b, and exhausted from the exhaust pipe 231. At this time, the $NH_3$ gas is supplied to the wafer 200.

Process conditions of this step are exemplified as follows.
Processing temperature: 200 to 400 degrees C., specifically 250 to 350 degrees C. in some embodiments
Processing pressure: 1 to 30 Torr (133 to 3,999 Pa)
$NH_3$ gas supply flow rate: 100 to 10,000 sccm
Gas supply time: 1 to 120 seconds.
Other process conditions are the same as the process conditions in the step 1.

The above-mentioned process conditions, particularly the temperature conditions, are the conditions under which at least a part of the cyclic structure composed of Si and C included in the first layer formed on the wafer 200 in the step 1 can be held (maintained) without being destructed. That is, the above-mentioned process conditions are the conditions under which at least a part of a plurality of cyclic structures included in the first layer of the wafer 200 are held as they are without being destructed. That is, the above-mentioned process conditions are the conditions under which at least a part of a plurality of Si—C bonds constituting the plurality of cyclic structures included in the first layer of the wafer 200 is held as they are. The Si—C bond constituting this cyclic structure is strong, making it difficult for C to be desorbed from Si.

By supplying an $NH_3$ gas to the wafer 200 under the above-mentioned conditions, at least a part of the first layer can be modified (nitrided). As a result, it is possible to desorb Cl, H, etc. from the first layer and introduce N contained in the $NH_3$ gas into the first layer with H bonded to N. That is, it is possible to bond N contained in the $NH_3$ gas to Si constituting the cyclic structure included in the first layer with H bonded to N. In this NH state, the Si—N bond bonded to Si is weak, which makes it easy to desorb N from Si. By nitriding the first layer in this manner, the first layer, which is a layer including a cyclic structure and containing Cl, can be converted into a second layer which is a layer including a cyclic structure and containing N.

That is, by supplying the $NH_3$ gas to the wafer 200 under the above-mentioned conditions, it is possible to introduce (leave) at least a part of the cyclic structure included in the first layer into the second layer, while the part being held as it is without being destructed. That is, nitriding of the first layer can be unsaturated (unsaturated nitridation) so as to leave at least a part of a plurality of cyclic structures included in the first layer as they are. As the first layer is nitrided, a silicon carbonitride layer (SiCN layer), which is a layer including the cyclic structure composed of Si and C and containing N, is formed as a second layer on the wafer 200, as shown in FIG. 6B. This SiCN layer is a layer containing Si, C and N and not containing O. In addition, C contained in the second layer is introduced into the second layer in a state of holding the cyclic structure composed of Si and C, and N contained in the second layer is introduced into the second layer with N bonded to H. That is, C contained in the second layer is hardly desorbed due to a strong Si—C bond, and N contained in the second layer is easily desorbed due to a weak Si—N bond.

After forming the second layer on the wafer 200, the valve 243b is closed to stop the supply of $NH_3$ gas into the process chamber 201. Then, the gas and the like remaining in the process chamber 201 is excluded from the process chamber 201 in the same procedure as the step 1.

An example of the nitriding agent (N-containing gas) may include a diazene ($N_2H_2$) gas, a hydrazine ($N_2H_4$) gas, a $N_3H_8$ gas or a gas containing these compounds, in addition to the $NH_3$ gas.

(Performing Predetermined Number of Times)

A cycle that non-simultaneously, i.e., alternately without synchronization, performs the steps 1 and 2 is performed a predetermined number of times (n times, n is an integer of one or more) to thereby form a SiCN film, which is a film including the cyclic structure composed of Si and C and containing N, as a first film on the wafer 200. This SiCN film is a film containing Si, C and N and not containing O. As shown in FIG. 6C, the first film is a SiCN film which is formed so as to fill the recess formed on the surface of the wafer 200 and has seams and voids. This cycle may be repeated multiple times in some embodiments.

(Purging)

After the film-forming step is completed, a $N_2$ gas is supplied from each of the gas supply pipes 232c and 232d into the process chamber 201 and is exhausted from the exhaust pipe 231. As a result, the interior of the process chamber 201 is purged to remove the gas, reaction by-products, and the like remaining in the process chamber 201 from the interior of the process chamber 201.

($H_2O$ Annealing Step)

After the film-forming step is completed and the purging in the process chamber 201 is completed, in a state where the wafer 200 subjected to the film-forming process is accommodated in the process chamber 201, a $H_2O$ gas is supplied as a first oxidizing agent to the wafer 200, specifically the SiCN film as the first film formed on the wafer 200, in the process chamber 201. Specifically, the opening/closing control of the valves 243e, 243c and 243d is performed in the same procedure as the opening/closing control of the valves 243a, 243c and 243d in the step 1. The flow rate of the $H_2O$ gas is adjusted by the MFC 241e, supplied into the process chamber 201 via the nozzle 249b, and exhausted from the exhaust pipe 231. At this time, the $H_2O$ gas is supplied to the wafer 200.

Process conditions of this step are exemplified as follows.
Processing temperature: 250 to 600 degrees C., specifically 250 to 500 degrees C. in some embodiments
Processing pressure: 1,333 to 101,325 Pa, specifically 53,329 to 101,325 Pa in some embodiments
$H_2O$ gas supply flow rate: 100 to 10,000 sccm
Supply time: 10 to 360 minutes, specifically 60 to 360 minutes in some embodiments.
Other process conditions are the same as the process conditions in the step 1.

The above-mentioned process conditions, particularly the temperature conditions, are the conditions under which while at least a part of the cyclic structure composed of Si and C included in the first film formed on the wafer 200 in the film-forming step is held (maintained) without being destructed, N contained in the first film may be substituted with O. That is, the above-mentioned process conditions are the conditions under which while at least a part of a plurality of cyclic structures included in the first film on the wafer 200 are held as they are without being destructed. That is, the above-mentioned process conditions are the conditions under which at least a part of a plurality of Si—C bonds constituting the plurality of cyclic structures included in the first film on the wafer 200 are held as they are.

That is, under the above-mentioned conditions, it is possible to substitute N contained in the first film with O, while at least a part of the cyclic structure contained in the first film is maintained without being destructed. That is, it is possible to substitute N contained in the first film with O while at least a part of a plurality of cyclic structures included in the first film remain in the film as they are.

Further, as described above, in the first film before the $H_2O$ annealing process, N is bonded in the state of NH to Si constituting the cyclic structure in the film. The Si—N bond in which N in the state of NH is bonded to Si is weak, and N is in a state of being easily desorbed. In addition, the Si—C bond constituting the cyclic structure in the first film is strong, and C is in a state of being hardly desorbed.

By subjecting the first film to the $H_2O$ annealing process under the above-mentioned conditions, the first film can be oxidized to cause a substitution reaction in which N contained in the first film is substituted with O contained in the $H_2O$ gas while at least a part of the cyclic structure (Si—C bonds) composed of Si and C included in the first film is maintained. At this time, N and Cl contained in the first film are desorbed from the first film together with H. Thus, by oxidizing the first film with the $H_2O$ gas, the first film including the cyclic structure and containing N can be converted into a second film including the cyclic structure and containing O. The second film is a SiOC film or a SiOCN film, that is, a SiOC(N) film. Then, by converting the first film into the second film in this manner, as shown in FIG. 6D, the thickness of the second film obtained by the $H_2O$ annealing process is increased (expanded) so as to be thicker than the thickness of the first film before the $H_2O$ annealing process. This film growth makes it possible to eliminate seams and voids in the first film.

As the first oxidizing agent (O-containing gas), it may be possible to use an $O_2$ gas or the like in addition to the $H_2O$ gas.

When an annealing process is performed using a plasma-excited $O_2$ gas ($O_2$*), oxygen radicals (O*), hydroxyl radicals (OH*) or the like as the first oxidizing agent, since the oxidizing power of O*, OH* or the like is too strong, the cyclic structure in the film may be destructed, and the above-mentioned effects such as the film growth may not be obtained. By using the $H_2O$ gas or the like, which has a relatively low oxidizing power, as the first oxidizing agent, it is easy to maintain the cyclic structure in the film without being destructed, and the above-mentioned effects such as the film growth can be obtained. If the cyclic structure in the film is destructed before the film growth, a later film growth action cannot be obtained and it becomes difficult to eliminate seams and voids.

($N_2$ Annealing Step)

After the $H_2O$ annealing step is completed, in a state where the wafer 200 subjected to the $H_2O$ annealing process is accommodated in the process chamber 201, a $N_2$ gas is supplied to the wafer 200, that is, the second film formed on the wafer 200, in the process chamber 201. Specifically, the flow rate of the $N_2$ gas is adjusted by the MFCs 241c and 241d, supplied into the process chamber 201 via the nozzles 249a and 249b, exhausted from the exhaust pipe 231. At this time, the $N_2$ gas is supplied to the wafer 200.

Process conditions of this step are exemplified as follows.
Processing temperature: 300 to 700 degrees C., specifically 400 to 700 degrees C. in some embodiments
Processing pressure: 67 to 101,325 Pa
$N_2$ gas supply flow rate: 1,000 to 5,000 sccm
Supply time: 10 to 120 minutes The above-mentioned process conditions are the conditions under which the water contained in the second film can be desorbed while at least a part of the cyclic structure composed of Si and C included in the second film formed in the $H_2O$ annealing step is held (maintained) without being destructed. That is, the above-mentioned process conditions are the conditions under which while at least a part of a plurality of cyclic structures included in the second film on the wafer 200 are held as they are without being destructed, the water contained in the second film can be desorbed. That is, the above-mentioned process conditions are the conditions under which while at least a part of a plurality of Si—C bonds constituting the plurality of cyclic structures included in the second film of the wafer 200 are held as they are, the water contained in the second film can be desorbed.

By subjecting the second film to the $N_2$ annealing process under the above-mentioned conditions, as shown in FIG. 6E, the water contained in the second film can be desorbed and removed while at least a part of the cyclic structure (Si—C bonds) composed of Si and C includes in the second film is maintained. The $N_2$ annealing step is also referred to as a water removing step.

The film-forming step, the $H_2O$ annealing step and the $N_2$ annealing step are carried out continuously in the same process chamber 201 without removing the wafer 200 from the process chamber 201 to the outside of the process chamber 201. That is, the film-forming step, the $H_2O$ annealing step, and the $N_2$ annealing step are continuously performed in-situ.

(Plasma Oxidizing Step)

After the $N_2$ annealing step is completed, in a state where the wafer 200 subjected to the $N_2$ annealing process is accommodated in the process chamber 201, a plasma-excited $O_2$ gas ($O_2$*) is supplied to the wafer 200, that is, the water-free second film formed on the wafer 200, in the process chamber 201. Specifically, the opening/closing control of the valves 243f, 243c and 243d is performed in the same procedure as the opening/closing control of the valves 243a, 243c and 243d in the step 1. The flow rate of the $O_2$ gas is adjusted by the MFC 241f, and the $O_2$ gas is plasma-excited by the plasma generation mechanism 270. The plasma-excited $O_2$ gas is supplied into the process chamber 201 via the nozzle 249b, and exhausted from the exhaust pipe 231. At this time, the $O_2$* is supplied to the wafer 200.

Process conditions of this step are exemplified as follows.
Processing temperature: room temperature (25 degrees C.) to 700 degrees C., specifically room temperature (25 degrees C.) to 300 degrees C. in some embodiments
Processing pressure: 10 to 1,000 Pa, specifically 10 to 500 Pa in some embodiments
$O_2$ gas supply flow rate: 100 to 10,000 sccm
$N_2$ gas supply flow rate: 0 to 20,000 sccm
RF power: 50 to 1,000 W The above-mentioned process conditions are the conditions under which while the cyclic structure included in the water-free second film on the wafer 200 is destructed, C or C and N, i.e., C (N), contained in the second film can be desorbed. That is, the above-mentioned process conditions are the conditions under which while the Si—C bonds constituting the cyclic structure included in the water-free second film on the wafer 200 are cut and C (N) contained in the second film can be removed.

That is, under the above-mentioned process conditions, while the cyclic structure included in the water-free second film is destructed without being held (while the Si—C bonds constituting the cyclic structure are cut without being held), C (N) contained in the second film can be desorbed and removed.

By subjecting the water-free second film to the plasma oxidizing process under the above-mentioned process conditions, the cyclic structure composed of Si and C included in the second film can be destructed (the Si—C bonds constituting the cyclic structure can be cut), and C contained in the second film can be desorbed and removed. At this time, when N is contained in the second film, C and N are desorbed and removed from the second film. Thus, by oxidizing the second film including the cyclic structure and containing O with a second oxidizing agent, this second film can be converted into a third film containing Si and O and not containing C and N. The third film is a film containing Si and O, that is, a SiO film.

As the second oxidizing agent (O-containing gas), it may be possible to use an ozone ($O_3$) gas, $O_3$ gas+$O_2$ gas, $O_2$ gas+$H_2$ gas, hydrogen peroxide ($H_2O_2$) gas, $H_2O_2$ gas+$H_2O$ gas, $H_2O_2$ gas+$H_2O$ gas+$O_2$ gas or the like in addition to $O_2^*$. In addition, gas species having a molecular structure (chemical structure) different from that of the first oxidizing agent is used as the second oxidizing agent.

Here, when an oxidizing process is performed under the same conditions, $O_2^*$, $H_2O_2$ gas and the like used as the second oxidizing agent have an oxidizing power higher than an oxidizing power of $H_2O$ gas used as the first oxidizing agent. That is, when an oxidizing process is performed under the same conditions, gas species having the oxidizing power higher than the oxidizing power of the first oxidizing agent are used as the second oxidizing agent.

(After-Purge and Returning to Atmospheric Pressure)

After the plasma oxidizing step is completed, a $N_2$ gas is supplied into the process chamber 201 from each of the gas supply pipes 232c and 232d, and exhausted from the exhaust pipe 231. Thus, the interior of the process chamber 201 is purged, and residual gas and reaction by-products remaining in the process chamber 201 are removed from the interior of the process chamber 201 (after-purge). Thereafter, the internal atmosphere of the process chamber 201 is substituted with an inert gas (inert gas substitution) and the internal pressure of the process chamber 201 is returned to an atmospheric pressure (returning to atmospheric pressure).

(Boat Unload and Wafer Discharge)

Thereafter, the seal cap 219 is moved down by the boat elevator 115 to open the lower end of the reaction tube 203. The processed wafers 200 supported by the boat 217 are unloaded from the lower end of the reaction tube 203 outside of the reaction tube 203 (boat unload). The processed wafers 200 are unloaded from the reaction tube 203 and are discharged from the boat 217 (wafer discharge).

(3) Effects According to the Present Embodiment

According to the present embodiment, one or more effects set forth below may be achieved.

(a) In the film-forming step, it is possible to include a cyclic structure composed of Si and C in the SiCN film formed on the wafer 200. As a result, a strong Si—C bond is introduced into the film, which makes it difficult for C contained in the film to be desorbed.

(b) In the film-forming step, it is possible to include N in the form of NH in the SiCN film formed on the wafer 200. As a result, a weak Si—N bond is formed in the film, which makes it easy to desorb N contained in the film.

(c) In the $H_2O$ annealing step, the cyclic structure composed of Si and C included in the SiCN film formed in the film-forming step can be maintained without being destructed. As a result, it is possible to substitute N contained in the film with O contained in the oxidizing agent in a state where the Si—C bond is held in the film. Further, all Cl contained in the film can be desorbed and removed.

(d) In the $H_2O$ annealing step, it is possible to convert the SiCN film including the cyclic structure composed of Si and C into a SiOC(N) film including the cyclic structure composed of Si and C, increasing (expanding) the film. As a result, seams and voids in the film disappear, thereby forming a seamless and void-free SiOC(N) film in a recess.

(e) In the $N_2$ annealing step, it is possible to desorb the water in the film while maintaining the cyclic structure composed of Si and C included in the SiOC(N) film formed in the $H_2O$ annealing step without destructing the structure. As a result, it is possible to desorb and remove the water in the film in a state where the Si—C bonds included in the SiOC(N) film are maintained.

(f) In the plasma oxidizing step, it is possible to desorb C(N) contained in the SiOC(N) film while destructing the cyclic structure composed of Si and C included in the water-free SiOC(N) film. As a result, it is possible to desorb and remove C(N) contained in the SiOC(N) film while cutting the Si—C bonds included in the SiOC(N) film.

(g) The above-described effects can be also similarly obtained in a case of using a gas satisfying the above requirements other than the TCDSCB gas as the precursor gas. In addition, the above-described effects can be also similarly obtained in a case of using a nitriding agent other than the $NH_3$ gas, a case of using a first oxidizing agent other than $H_2O$ gas, a case of using a second oxidizing agent other than $O_2^*$, and a case of using an inert gas other than $N_2$ gas.

Other Embodiments

While some embodiments of the present disclosure have been specifically described above, the present disclosure is not limited to the aforementioned embodiments but may be differently modified without departing from the subject matter of the present disclosure.

For example, as in a processing sequence to be described below, a $H_2O_2$ oxidizing step of supplying a $H_2O_2$ gas to the SiOC(N) film as the second film formed on the wafer 200 may be performed instead of the above-described plasma oxidizing step. This case can also obtain the same effects as the processing sequence shown in FIG. 4.

(TCDSCB→$NH_3$)×
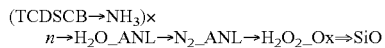

Process conditions of this step ($H_2O_2$ oxidizing n step) are exemplified as follows.

Processing temperature: 80 to 450 degrees C., specifically 250 to 450 degrees C. in some embodiments
Processing pressure: 70,000 to 100,000 Pa
Total supply flow rate of $H_2O_2$ gas+$H_2O$ gas: 1 to 10 sccm
$O_2$ gas (carrier gas) supply flow rate: 0 to 20,000 sccm
In this step, the $H_2O$ gas or the $O_2$ gas may not be supplied. That is, in this step, the $H_2O_2$ gas may be supplied alone, or the $H_2O_2$ gas and the $H_2O$ gas may be supplied without supplying the $O_2$ gas, or the $H_2O_2$ gas and the $O_2$ gas may be supplied without supplying the $H_2O$ gas. Other process conditions may be the same as the process conditions in the above-described embodiment.

In addition, for example, the water removing step and the plasma oxidizing step or the $H_2O_2$ oxidizing step (hereinafter also referred to as a plasma/$H_2O_2$ oxidizing step) may be performed simultaneously. That is, when C (N) in the film is desorbed and removed by the plasma/$H_2O_2$ oxidizing step, the water in the film may be desorbed and removed simultaneously. This case can also obtain the same effects as the processing sequence shown in FIG. 4, and furthermore, it is possible to simultaneously perform the removal of water and the removal of C(N) from the film, thereby improving the productivity. In this case, each step is continuously performed in a state where the wafer 200 is accommodated in the process chamber 201 without being taken out of the process chamber 201 to the outside of the process chamber 201. That is, the film-forming step, the $H_2O$ annealing step, the water removing step and the plasma/$H_2O_2$ oxidizing step are sequentially performed in this order in the same process chamber (in-situ). In this case, the plasma/$H_2O_2$ oxidizing step performed simultaneously with the water removing step is performed under the conditions that the water contained in the SiOC(N) film formed in the $H_2O$ annealing step can be desorbed while destructing the cyclic structure composed of Si and C included in the SiOC(N) film. That is, the plasma/$H_2O_2$ oxidizing step performed simultaneously with the water removing step is performed under the conditions that the water contained in the SiOC(N) film can be desorbed by thermal energy by heating while cutting the Si—C bonds constituting the cyclic structure included in the SiOC(N) film by energy of $O_2^*$ or $H_2O_2$. The process conditions in the plasma/$H_2O_2$ oxidizing step performed simultaneously with the water removing step are as follows. Other process conditions are the same as the process conditions in the above-described embodiment.

Processing temperature in plasma oxidizing step: 300 to 700 degrees C.

Processing temperature in $H_2O_2$ oxidizing step: 300 to 450 degrees C.

That is, in any case, by setting the processing temperature to 300 degrees C. or higher, it is possible to desorb and remove the water in the SiOC(N) film.

The example in which the film-forming step, the $H_2O$ annealing step, the $N_2$ annealing step and the plasma/$H_2O_2$ oxidizing step are sequentially performed in the same process chamber (in-situ) has been described in the aforementioned embodiments. The present disclosure is not limited to the aforementioned embodiments. For example, using a stand-alone type apparatus or a cluster type apparatus in which a plurality of process chambers are installed around a transfer chamber, the film-forming step to the $N_2$ annealing step may be first sequentially performed in the same process chamber (in-situ), and then the plasma/$H_2O_2$ oxidizing step may be performed in a different process chamber (ex-situ). This is because, if at least the process from the film-forming step to the $N_2$ annealing step is performed in the same process chamber, the SiOC(N) film as the second film exposed on the wafer surface when the processed wafers is transferred to another apparatus does not absorb water even if it is exposed to the atmosphere.

Recipes used in substrate processing may be prepared individually according to the processing contents and may be stored in the memory device 121c via a telecommunication line or the external memory device 123 in some embodiments. Moreover, at the start of the substrate processing, the CPU 121a may properly select an appropriate recipe from the recipes stored in the memory device 121c according to contents of the substrate processing in some embodiments. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which films are formed using a batch-type substrate processing apparatus capable of processing a plurality of substrates at a time has been described in the aforementioned embodiments. The present disclosure is not limited to the aforementioned embodiments but may be appropriately applied to, e.g., a case where films are formed using a single-wafer-type substrate processing apparatus capable of processing a single substrate or several substrates at a time. In addition, the example in which films are formed using a substrate processing apparatus including a hot-wall-type process furnace has been described in the aforementioned embodiments. The present disclosure is not limited to the aforementioned embodiments but may be appropriately applied to a case where films are formed using a substrate processing apparatus including a cold-wall-type process furnace.

Even in the case of using these substrate processing apparatuses, film formation can be performed under the same processing procedures and processing conditions as in the aforementioned embodiments and modifications, and the same effects as those of the aforementioned embodiment and modifications can be obtained.

In addition, the above-described embodiments and modifications can be used in appropriate combination. The processing procedures and processing conditions at this time may be the same as the processing procedures and processing conditions of the above-described embodiments and modifications.

Hereinafter, examples will be described.

EXAMPLES

Figure 7A:
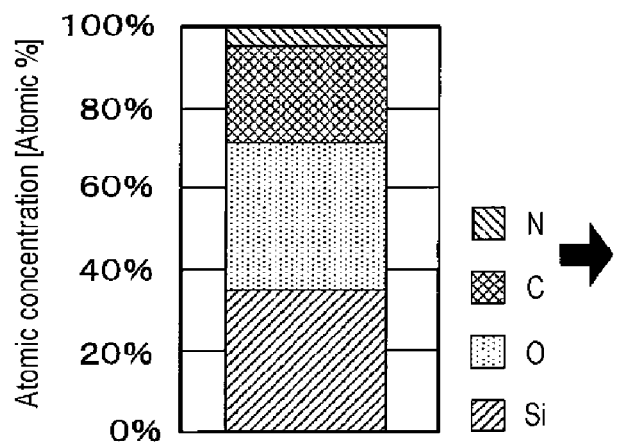
FIG. 7A is a view showing a composition ratio of a film formed in a recess of Sample 1 before a plasma oxidizing process.
Figure 7B:
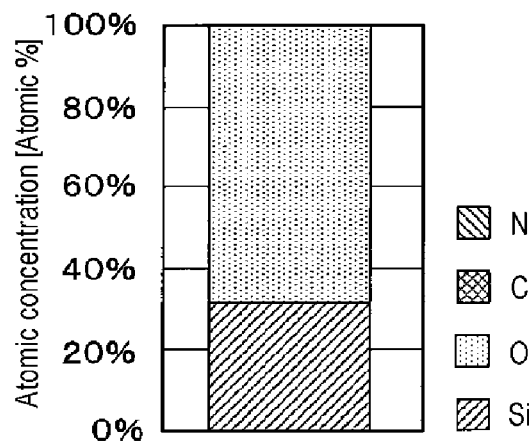
FIG. 7B is a view showing a composition ratio of a film formed in a recess of Sample 1 after a plasma oxidizing process.

As Sample 1, the substrate processing apparatus shown in FIG. 1 is used to form a SiO film in a recess on a wafer according to the substrate processing sequence shown in FIG. 4. Process conditions are predetermined conditions within the process condition range in the above-described embodiments. When Sample 1 is prepared, atomic concentrations of Si, O, C and N in each film before and after the plasma oxidizing step are measured by X-ray photoelectron spectroscopy (XPS). FIG. 7A is a view showing the atomic concentrations of Si, O, C and N, that is, composition ratio thereof, in a film formed in the recess before the plasma oxidizing step of Sample 1. FIG. 7B is a view showing the atomic concentrations of Si, O, C and N, that is, composition ratio thereof, in the film formed in the recess after the plasma oxidizing step of Sample 1.

Figure 7C:
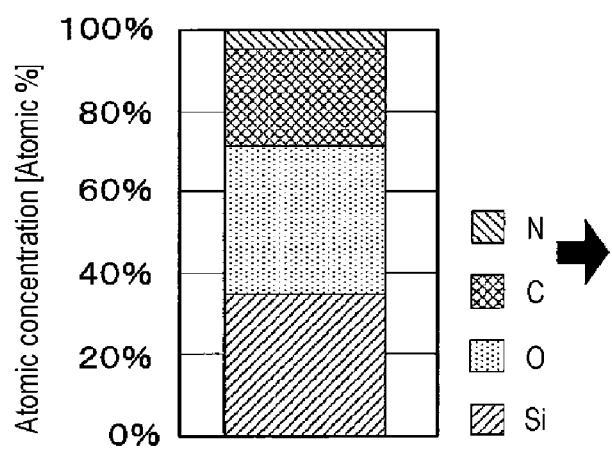
FIG. 7C is a view showing a composition ratio of a film formed in a recess of Sample 2 before a $H_2O_2$ oxidizing process.
Figure 7D:
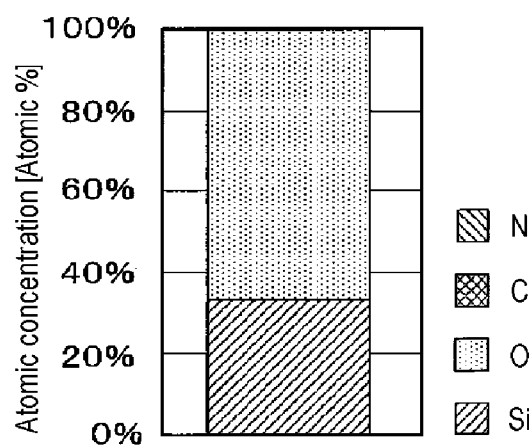
FIG. 7D is a view showing a composition ratio of a film formed in a recess of Sample 2 after a $H_2O_2$ oxidizing process.

As Sample 2, the substrate processing apparatus shown in FIG. 1 is used to form a SiO film in a recess on a wafer by performing the $H_2O_2$ oxidizing step instead of the plasma oxidizing step in the substrate processing sequence shown in FIG. 4. Process conditions are predetermined conditions within the process condition range in the above-described embodiments and the above-described $H_2O_2$ oxidizing step. When Sample 2 is prepared, atomic concentrations of Si, O, C and N in each film before and after the $H_2O_2$ oxidizing step are measured by XPS. FIG. 7C is a view showing the atomic concentrations of Si, O, C and N, that is, composition ratio thereof, in a film formed in the recess before the $H_2O_2$ oxidizing step of Sample 2. FIG. 7D is a view showing atomic concentrations of Si, O, C and N, that is, composition ratio thereof, in a film formed in the recess after the $H_2O_2$ oxidizing step of Sample 2.

As shown in FIG. 7A, before the plasma oxidizing process, the atomic concentration of each element contained in the film formed in the recess is 35.5% for Si, 36.3% for O, 23.4% for C and 4.7% for N. That is, this film is a SiOCN film. In addition, the atomic concentration of Cl contained in this film is 0%. That is, it is considered that all Cl contained in the film is desorbed and removed by the $H_2O$ annealing process. On the other hand, as shown in FIG. 7B, after the plasma oxidizing process, the atomic concentration of each element contained in the film formed in the recess is 32.7% for Si, 67.3% for O and 0% for C, N and Cl. That is, it can be seen that a SiO film close to the stoichiometric composition is formed by the plasma oxidizing process. Since the O/Si ratio in the SiO film is substantially 2, it can be said that the SiO film is substantially a $SiO_2$ film of the stoichiometric composition. That is, by performing the plasma oxidizing process on the SiOCN film formed in the recess, it is confirmed that all C and N contained in the SiOCN film are desorbed and removed, and the SiOCN film is converted into the SiO film.

Further, as shown in FIG. 7C, before the $H_2O_2$ oxidizing process, as in FIG. 7A, the atomic concentration of each element contained in the film formed in the recess is 35.5% for Si, 36.3% for O, 23.4% for C, 4.7% for N and 0% for Cl. This film is a SiOCN film. On the other hand, as shown in FIG. 7D, after the $H_2O_2$ oxidizing process, the atomic concentration of each element contained in the film formed in the recess is 32.8% for Si, 67.2% for O and 0% for C, N and Cl. That is, it can be seen that the SiO film close to the stoichiometric composition is formed by the $H_2O_2$ oxidizing process. Since the O/Si ratio in the SiO film is substantially 2, it can be said that the SiO film is substantially a $SiO_2$ film of the stoichiometric composition. That is, by performing the $H_2O_2$ oxidizing process on the SiOCN film formed in the recess, it is confirmed that all C and N contained in the SiOCN film are desorbed and removed, and the SiOCN film is converted into the SiO film.

That is, by forming the SiCN film to fill the recess formed on the surface of the wafer under the condition that the cyclic structure composed of Si and C included in the precursor is maintained and performing a $H_2O$ annealing process under the conditions that the cyclic structure included in the SiCN film is maintained, the SiCN film is converted into a SiOC(N), thereby increasing (expanding) the film. In addition, by performing the plasma oxidizing process or the $H_2O_2$ oxidizing process under the conditions that the cyclic structure included in the SiOC(N) film is destructed, the SiOC(N) film can be converted into the SiO film. It can be confirmed that the recess can be seamlessly and void-freely filled with the SiO film by such series of processes.

According to the present disclosure in some embodiments, it is possible to form a seamless and void-free film on a substrate having recesses such as trenches and holes formed on its surface.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) forming a first film including a cyclic structure composed of silicon and carbon and also including nitrogen so as to fill a recess formed in a surface of a substrate by performing a cycle a predetermined number of times, the cycle including non-simultaneously performing:
      supplying a precursor including the cyclic structure and also including halogen to the substrate having the recess formed on its surface; and
      supplying a nitriding agent to the substrate;
   (b) converting the first film into a second film including the cyclic structure and also including oxygen by supplying a first oxidizing agent to the substrate; and
   (c) converting the second film into a third film including silicon and oxygen and not including carbon and nitrogen by supplying a second oxidizing agent to the substrate.

2. The method of claim 1, wherein the first film has at least one of a seam and a void, and
   wherein in (b), at least one of the seam and the void is extinguished by a film growth which occurs when the first film is converted into the second film.

3. The method of claim 1, wherein (a) is carried out under a condition that the cyclic structure included in the precursor is maintained,
   wherein (b) is carried out under a condition that the cyclic structure included in the first film is maintained, and
   wherein (c) is carried out under a condition that the cyclic structure included in the second film is destructed.

4. The method of claim 1, wherein the cyclic structure includes a Si—C bond,
   wherein (a) is carried out under a condition that a Si—C bond included in the precursor is maintained,
   wherein (b) is carried out under a condition that a Si—C bond included in the first film is maintained, and
   wherein (c) is carried out under a condition that a Si—C bond included in the second film is cut.

5. The method of claim 1, wherein (b) is carried out under a first condition, and (c) is carried out under a second condition different from the first condition.

6. The method of claim 1, wherein (b) is carried out under a first oxidation condition, and (c) is carried out under a second oxidation condition in which an oxidizing power is higher than an oxidizing power in the first oxidation condition.

7. The method of claim 1, wherein the second oxidizing agent is different in a molecular structure from the first oxidizing agent.

8. The method of claim 1, wherein the second oxidizing agent has an oxidizing power higher than an oxidizing power which the first oxidizing agent has when an oxidizing process is performed under the same condition.

9. The method of claim 1, wherein the first oxidizing agent includes a $H_2O$ gas, and
wherein the second oxidizing agent includes at least one selected from the group of plasma-excited $O_2$ gas, $O_3$ gas, $O_3$ gas+$O_2$ gas, $O_2$ gas+$H_2$ gas, $H_2O_2$ gas, $H_2O_2$ gas+$H_2O$ gas, and $H_2O_2$ gas+$H_2O$ gas+$O_2$ gas.

10. The method of claim 1, wherein in (b), the nitrogen contained in the first film is substituted with the oxygen, and
wherein in (c), the carbon or the carbon and the nitrogen contained in the second film are desorbed.

11. The method of claim 1, wherein in (b), the nitrogen contained in the first film is substituted with the oxygen while the cyclic structure included in the first film is maintained, and
wherein in (c), the carbon or the carbon and the nitrogen contained in the second film is desorbed while the cyclic structure included in the second film is destructed.

12. The method of claim 1, wherein the cyclic structure includes a Si—C bond,
wherein in (b), the nitrogen contained in the first film is substituted with the oxygen while a Si—C bond included in the first film is maintained, and
wherein in (c), the carbon or the carbon and the nitrogen contained in the second film is desorbed while a Si—C bond included in the second film is cut.

13. The method of claim 1, wherein, the first film further contains the halogen, and
wherein in (b), the halogen contained in the first film is desorbed.

14. The method of claim 1, wherein the second film contains water, and further comprising:
(d) desorbing the water contained in the second film.

15. The method of claim 14, wherein (c) is carried out after (a), (b) and (d) are carried out in this order in the same process chamber.

16. The method of claim 14, wherein (c) and (d) are carried out simultaneously, and
wherein (a), (b), (c) and (d) are carried out in this order in the same process chamber.

17. A substrate processing apparatus comprising:
a process chamber in which a substrate is processed;
a precursor supply system configured to supply a precursor including a cyclic structure composed of silicon and carbon and also including halogen to the substrate in the process chamber;
a nitriding agent supply system configured to supply a nitriding agent to the substrate in the process chamber;
a first oxidizing agent supply system configured to supply a first oxidizing agent to the substrate in the process chamber;
a second oxidizing agent supply system configured to supply a second oxidizing agent to the substrate in the process chamber; and
a controller configured to control the precursor supply system, the nitriding agent supply system, the first oxidizing agent supply system and the second oxidizing agent supply system to perform a process in the process chamber, the process including:
(a) forming a first film including the cyclic structure and also including nitrogen so as to fill a recess formed in a surface of the substrate by performing a cycle a predetermined number of times, the cycle including non-simultaneously performing:
supplying the precursor to the substrate having the recess formed on its surface; and
supplying the nitriding agent to the substrate;
(b) converting the first film into a second film including the cyclic structure and also including oxygen by supplying the first oxidizing agent to the substrate; and
(c) converting the second film into a third film including silicon and oxygen and not including carbon and nitrogen by supplying the second oxidizing agent to the substrate.

18. A non-transitory computer-readable recording medium storing a program that causes, by a computer, a substrate processing apparatus to perform a process in a process chamber of the substrate processing apparatus, the process comprising:
(a) forming a first film including a cyclic structure composed of silicon and carbon and also including nitrogen so as to fill a recess formed in a surface of a substrate by performing a cycle a predetermined number of times, the cycle including non-simultaneously performing:
supplying a precursor including the cyclic structure and also including halogen to the substrate having the recess formed on its surface; and
supplying a nitriding agent to the substrate;
(b) converting the first film into a second film including the cyclic structure and also including oxygen by supplying a first oxidizing agent to the substrate; and
(c) converting the second film into a third film including silicon and oxygen and not including carbon and nitrogen by supplying a second oxidizing agent to the substrate.

* * * * *